| | | | | |
|---|---|---|---|---|
| (12) | United States Patent | (10) | Patent No.: | US 7,851,927 B2 |
| | Hosseini et al. | (45) | Date of Patent: | Dec. 14, 2010 |

(54) SEMICONDUCTOR COMPONENT COMPRISING A SEMICONDUCTOR CHIP AND SEMICONDUCTOR COMPONENT CARRIER WITH EXTERNAL CONNECTION STRIPS

(75) Inventors: Khalil Hosseini, Weihmichl (DE); Alexander Koenigsberger, Regensburg (DE); Ralf Otremba, Kaufbeuren (DE); Klaus Schiess, Allensbach (DE)

(73) Assignee: Infineon Technologies AG (DE)

( * ) Notice: Subject to any disclaimer, the term of this patent is extended or adjusted under 35 U.S.C. 154(b) by 16 days.

(21) Appl. No.: 11/619,350

(22) Filed: Jan. 3, 2007

(65) Prior Publication Data
US 2008/0146010 A1 Jun. 19, 2008

(30) Foreign Application Priority Data
Dec. 19, 2006 (DE) .................. 10 2006 060 484

(51) Int. Cl.
*H01L 21/28* (2006.01)
(52) U.S. Cl. .............. 257/778; 257/678; 257/690; 257/734; 257/E23.055; 257/E21.503
(58) Field of Classification Search .......... 438/108, 438/111, 118, 119, 123–126, 612, 666; 257/678, 257/690, 693, 698, 702, 722, 734, 735, 778, 257/783, E23.034, E23.055
See application file for complete search history.

(56) References Cited

U.S. PATENT DOCUMENTS

| 6,040,626 | A | 3/2000 | Cheah et al. ............. 257/735 |
| 6,249,041 | B1 | 6/2001 | Kasem et al. ............ 257/666 |
| 6,319,755 | B1 | 11/2001 | Mauri .................... 438/119 |
| 6,774,466 | B1 | 8/2004 | Kajiwara et al. |
| 6,841,421 | B2 | 1/2005 | Aono et al. .............. 438/121 |
| 7,161,234 | B2 | 1/2007 | Otremba ................. 257/686 |
| 7,220,617 | B2* | 5/2007 | Kagii et al. ............. 438/106 |
| 2004/0063240 | A1 | 4/2004 | Madrid et al. |
| 2005/0023670 | A1 | 2/2005 | Hata et al. |
| 2005/0082679 | A1 | 4/2005 | Otremba |
| 2005/0167849 | A1* | 8/2005 | Sato ...................... 257/778 |
| 2005/0269694 | A1* | 12/2005 | Luechinger ............. 257/724 |

(Continued)

FOREIGN PATENT DOCUMENTS

DE 10003671 8/2000

(Continued)

OTHER PUBLICATIONS

First Examination Report for DE102006060484.9-32, dated Nov. 1, 2007.

*Primary Examiner*—David Vu
*Assistant Examiner*—Suberr Chi
(74) *Attorney, Agent, or Firm*—Banner & Witcoff, Ltd.

(57) ABSTRACT

A semiconductor component (1) has a semiconductor chip (5) and a semiconductor component carrier (3) with external connection strips (12, 13, 15). The semiconductor chip (5) has a first electrode (6) and a control electrode (7) on its top side (8) and a second electrode (9) on its rear side (10). The semiconductor chip (5) is fixed by its top side (8) in flip-chip arrangement (11) on a first and a second external connection strip (12, 13) for the first electrode (6) and the control electrode (7). The second electrode (9) is electrically connected to at least one third external connection strip (15) via a bonding tape (14).

34 Claims, 7 Drawing Sheets

U.S. PATENT DOCUMENTS

| | | |
|---|---|---|
| 2007/0040252 A1 | 2/2007 | Hosseini |
| 2007/0085201 A1 | 4/2007 | Bauer et al. |
| 2007/0200219 A1 | 8/2007 | Otremba |
| 2007/0228556 A1 | 10/2007 | Hosseini et al. |
| 2007/0246808 A1 | 10/2007 | Ewe et al. |
| 2008/0111232 A1* | 5/2008 | Pavier ................ 257/711 |

FOREIGN PATENT DOCUMENTS

| | | |
|---|---|---|
| DE | 103 33 800 B3 | 10/2004 |
| DE | 10349477 | 2/2005 |
| DE | 102006008632 | 8/2007 |
| DE | 102006013853 | 10/2007 |
| DE | 102006015447 | 10/2007 |
| EP | 1187204 | 3/2002 |
| JP | 2002 208673 A | 7/2002 |
| WO | 2006/012847 A1 | 2/2006 |
| WO | 2006072032 | 7/2006 |

* cited by examiner

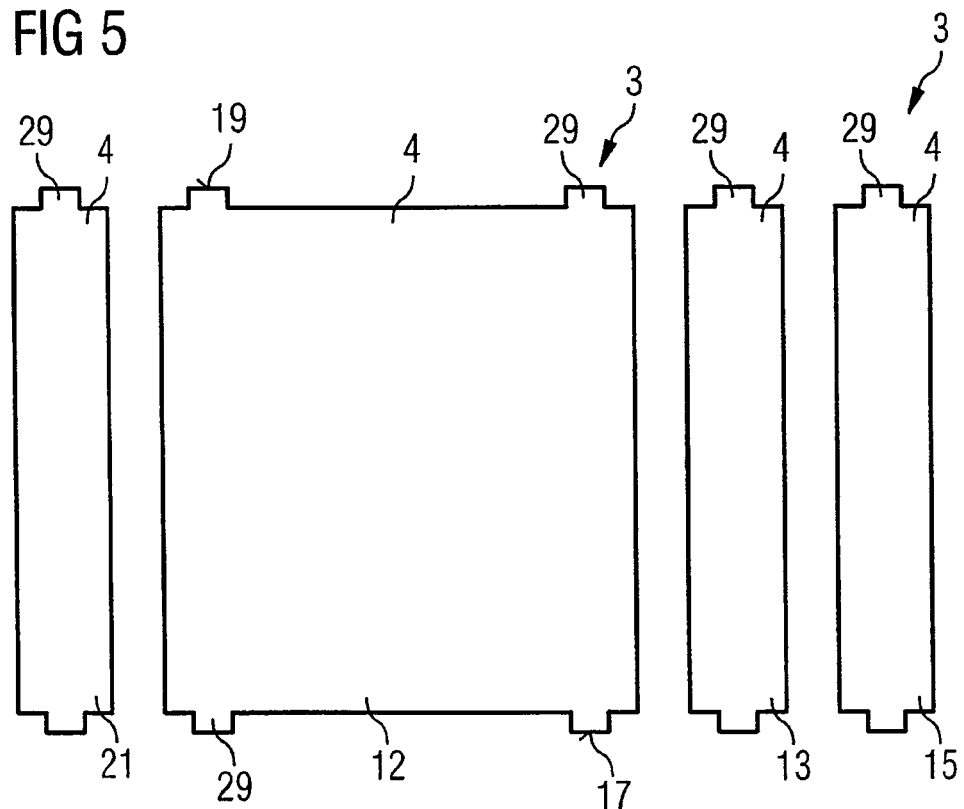
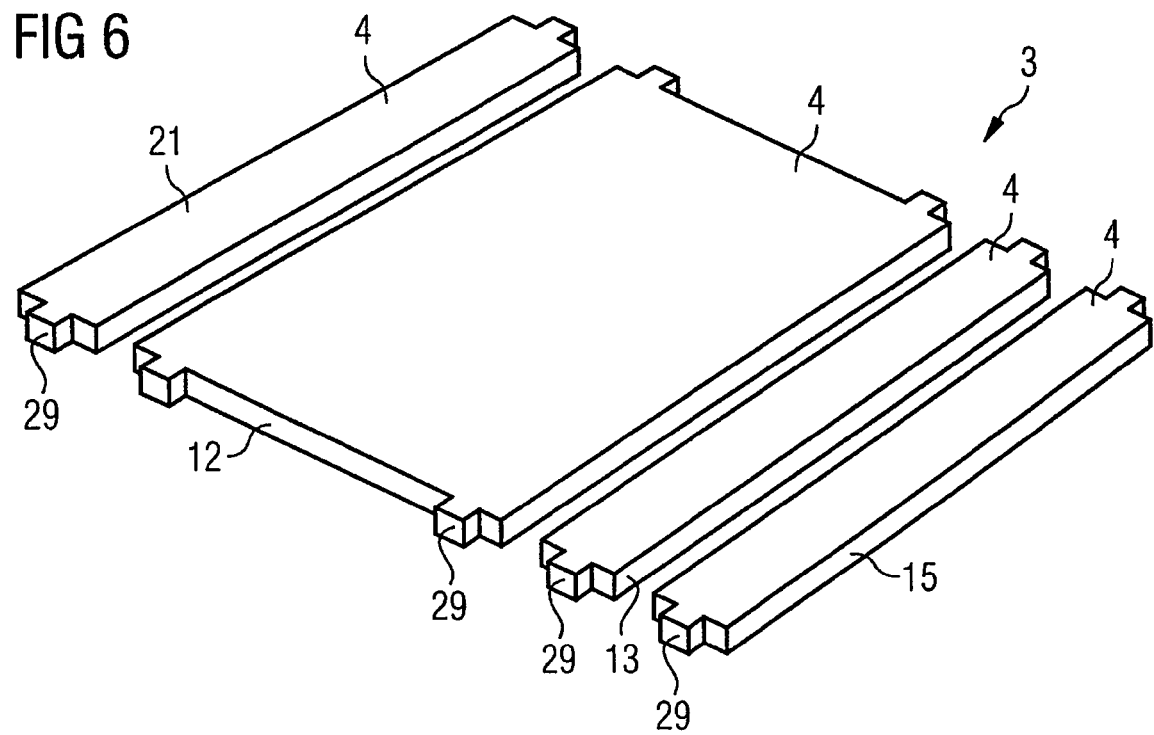

SEMICONDUCTOR COMPONENT COMPRISING A SEMICONDUCTOR CHIP AND SEMICONDUCTOR COMPONENT CARRIER WITH EXTERNAL CONNECTION STRIPS

RELATED APPLICATION

This application claims priority from German Patent Application No. DE 10 2006 060 484.9, which was filed on Dec. 19, 2006, and is incorporated herein by reference in its entirety.

TECHNICAL FIELD

The invention relates to a semiconductor component comprising a semiconductor chip and a method for producing the same.

BACKGROUND

The semiconductor component has the semiconductor chip and a semiconductor component carrier with external connections. The semiconductor chip, which is fixed on the semiconductor component carrier, has a first electrode and a control electrode on its top side and a second electrode on its rear side.

In the case of known semiconductor components, semiconductor chips of this type are electrically conductively fixed by their rear sides on an external connection by means of a solder paste, for example, with the result that it is possible to access the second electrode on the rear side of the semiconductor chip via the external connection of the semiconductor component carrier. Further external connections of the semiconductor component carrier are arranged on the underside of the semiconductor component. The first electrode on the top side of the semiconductor chip is electrically connected to at least one of the external connections via an electrically conductive clip as connecting element, the mechanically rigid connecting clip being fixed by means of a solder paste, for example, on the first electrode of the top side of the semiconductor chip and on the external connection.

In the case of a semiconductor component of this type, the individual connecting clip has to be adapted exactly to the thickness of the semiconductor chip in order to achieve a secure fixing and electrical connection. This means an increased outlay in respect of stock-keeping since a connecting clip adapted in terms of width, height and step level is required for each semiconductor chip. In this case, the external connections are completely limited to the underside of the semiconductor component in terms of their areal extent.

Furthermore, it is known to construct a semiconductor component on a leadframe as semiconductor component carrier, in which the second electrode on the rear side of the semiconductor component is fixed on a central chip island of the leadframe, while the control electrode on the top side of the semiconductor component is fixed by means of a bonding wire to an external connection projecting laterally from the housing of the semiconductor component, and the first electrode on the top side of the semiconductor chip is in turn contact-connected by means of a rigid connecting clip within the housing to external connections projecting laterally from the housing.

What is common to these known semiconductor components is that the rear sides of the semiconductor chips are oriented toward the underside of the semiconductor component, from where they are electrically connected to an external connection, while the first electrode and the control electrode situated on the top sides of the semiconductor chips are electrically connected via a bonding wire or via a rigid electrically conductive clip.

A similar concept is also realized in the case of the so-called "Polar Pak" with a clip contact-connection on the rear side of the semiconductor chip, but the contact-connection of both semiconductor chip sides, namely the top side and the rear side, is disadvantageous since, as a result, the heat dissipation is restricted and, consequently, the possible temperature of the pn junction, as is customary in semiconductor chips, cannot be fully exploited without the solder paste connection in incurring damage. Moreover, such a concept with clip contact-connection and solder pastes is cost-intensive since both the top side and the rear side have to be provided with solderable coatings on the semiconductor chip electrodes.

SUMMARY

According to an embodiment, the semiconductor component has the semiconductor chip and a semiconductor component carrier with external connection strips. The semiconductor chip has a first electrode and a control electrode on its top side and a second electrode on its rear side. The semiconductor chip is fixed by its top side in flip-chip arrangement on a first and a second external connection strip for the first electrode and the control electrode. The second electrode is electrically connected to at least one third external connection strip via a bonding tape.

BRIEF DESCRIPTION OF THE DRAWINGS

The invention will now be explained in more detail with reference to the accompanying figures.

FIGS. 5 to 11 show schematic views of components during the production of a semiconductor component in accordance with FIG. 3;

FIG. 5 shows a schematic plan view of a semiconductor component carrier for a semiconductor component in accordance with FIG. 3;

FIG. 6 shows a schematic perspective view of the semiconductor component carrier in accordance with FIG. 5;

FIG. 7 shows a schematic perspective view of the semiconductor component carrier in accordance with FIG. 6 after the application of a solder paste;

FIG. 8 shows a schematic perspective view of the semiconductor component carrier in accordance with FIG. 7 with a semiconductor chip prior to the application thereof to the semiconductor component carrier;

FIG. 9 shows a schematic perspective view of the semiconductor chip in flip-chip arrangement on the semiconductor component carrier in accordance with FIG. 8;

FIG. 10 shows a schematic side view of the semiconductor component carrier with semiconductor chip and applied bonding tape;

FIG. 11 shows a schematic plan view of the semiconductor component carrier with semiconductor chip in accordance with FIG. 10.

DETAILED DESCRIPTION

Figure 1:
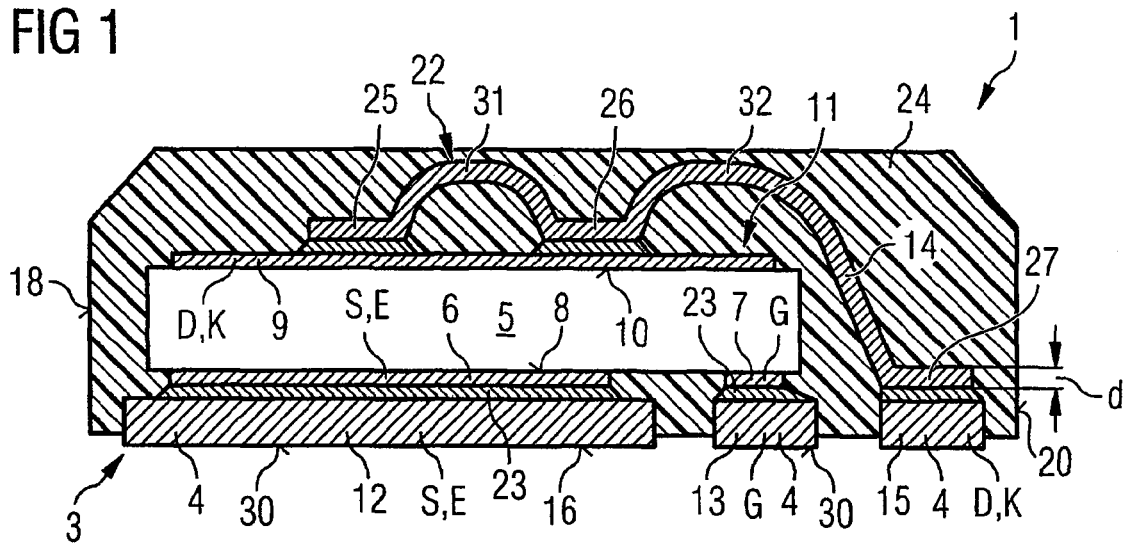
FIG. 1 shows a schematic cross section through a semiconductor component of one embodiment.

FIG. 1 shows a schematic cross section through a semiconductor component 1 in accordance with one embodiment. The semiconductor component 1 is constructed on a semiconductor component carrier 3 having external connection strips 4 arranged on the underside 16 of the semiconductor component 1. A semiconductor chip 5 is fixed in flip-chip arrangement 11 by first electrode 6 and control electrode 7 of its top side 8 on a first and a second external contact strip 12 and 13, respectively. In this case, the first electrode 6 on the top side 8 of the semiconductor chip 5 is electrically connected to a first external connection strip 12 and the control electrode 7 is electrically connected to a second external connection strip 13.

A second electrode 9 arranged on the rear side 10 of the semiconductor chip 5, said second electrode covering virtually the entire rear side 10, is electrically connected to a third external connection strip 15 via a bonding tape 14. In this embodiment, said bonding tape 14 makes contact with the second electrode 9 in the regions 25 and 26 and is fixed by its further region 27 on the third external connection strip 15. The bonding tape 14 may comprise a gold-plated copper tape, an aluminum tape or a pure gold tape or alloys of copper, aluminum or gold. In this embodiment, the bonding tape 14 comprises pure aluminum or an aluminum alloy which is compliant and readily deformable, and is applied by means of a thermocompression sonic method. The top side of the second electrode 9 has a gold coating. The top side of the copper-containing external connection strip 15 has a multilayer coating in which the topmost coating layer likewise comprises a gold or a gold alloy. During the thermocompression sonic method, a thermocompression sonic structure having a solidified finely crystalline eutectic Al/Au melt forms between aluminum and gold.

The external connection strips 12 and 13 on which the first electrode 6 and the control electrode 7 are arranged likewise have, as basic material, copper or a copper alloy provided with a coating composed of gold, silver or palladium/gold or alloys thereof. In this case, the external connection strips have the form of leads of a leadframe as semiconductor component carrier 3, on which semiconductor components 1 of this type can be constructed.

A cohesive connecting layer 23 is arranged between the first electrode 6 and the first external connection strip 12 and also between the control electrode 7 and the second external connection strip 13, which connecting layer may have arisen from a solder paste. Consequently, the cohesive connecting layer may comprise a soft solder layer or, in a further embodiment, comprise a lead-free solder layer. On the other hand, it is also possible to connect the first electrode 6 and the control electrode 7 cohesively to the external connection strips 12 and 13, respectively, by means of a diffusion solder layer. Furthermore, there is the possibility of using an adhesive layer of a conductive adhesive instead of solder layers.

The semiconductor chip 5, the bonding tape 14 and the external connection strips 4 are embedded in a plastic housing composition 24, the plastic housing composition 24 leaving free external contact areas 30 of the external connection strips 4 on the underside 16 of the semiconductor component 1. The external connection strips 4 are therefore arranged in such a way that they are surface-mountable, with the result that the semiconductor component 1 can be connected on a superordinate circuit board by means of surface mounting.

The semiconductor chip 5 may have a MOSFET structure, the first electrode 6 being a source electrode S, the control electrode 7 being a gate electrode G and the second electrode 9 being a drain electrode. These electrodes can be accessed via the external connection strips 12, 13 and 15 on the underside 16 of the semiconductor component 1.

Moreover, it is possible for the semiconductor chip 5 to have an IGBT structure, the first electrode 6 being an emitter electrode E, the control electrode 7 being a gate electrode G and the second electrode 9 being a collector electrode K. In this structure, too, the electrodes of the IGBT structure can be accessed via the external contact areas 30.

Figure 2:
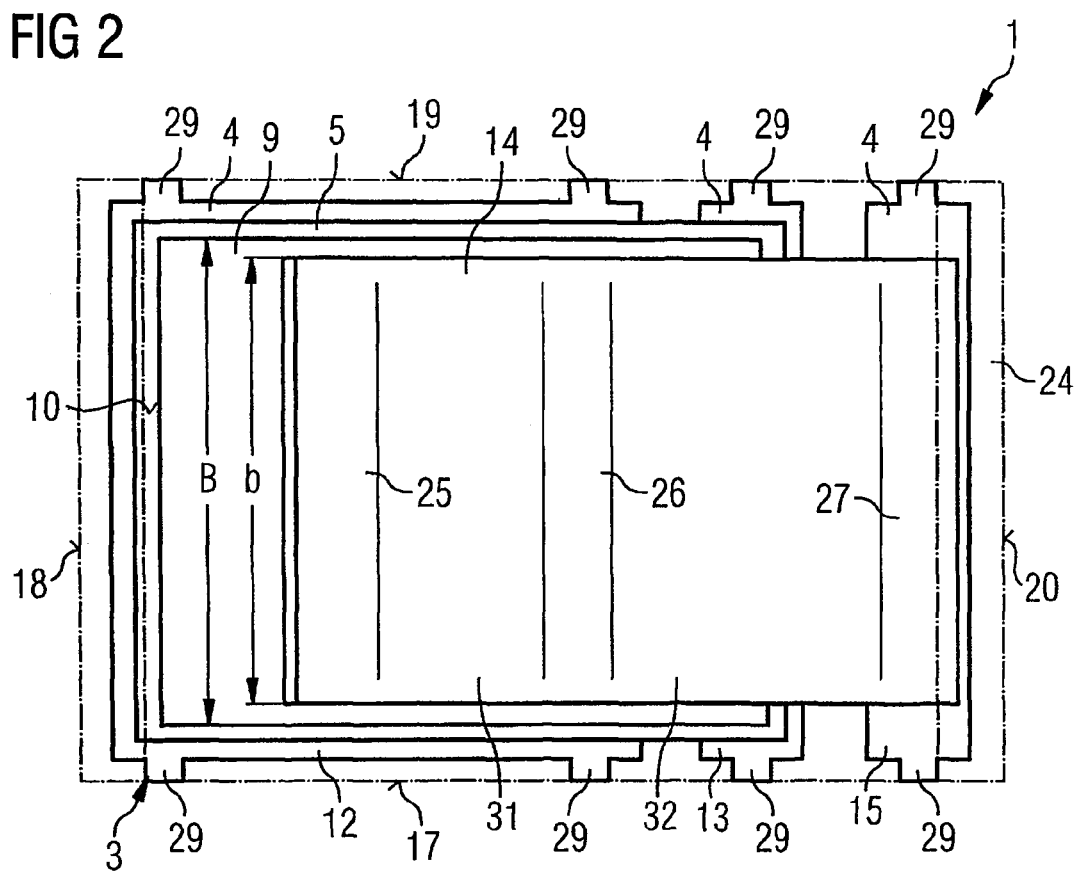
FIG. 2 shows a schematic plan view of the semiconductor component in accordance with FIG. 1.

FIG. 2 shows a schematic plan view of the semiconductor component 1 in accordance with FIG. 1. In order to show the construction of the components within the semiconductor component 1, the plastic housing composition 24 has been omitted and only the edges 17, 18, 19 and 20 of the plastic housing composition 24 are depicted by dash-dotted lines. Four planes can be seen in this plan view, on the one hand the plane of the top sides of the external connection strips 4, then the plane of the rear side 10 of the semiconductor chip 5 and finally thereon the plane of the second electrode 9, which covers virtually the entire rear side 10 of the semiconductor chip 5.

The structure of the bonding tape 14 can be seen thereon, which bonding tape makes contact with the electrode 9 on the rear side 10 of the semiconductor chip 5 in the regions 25 and 26 and together with the coating of the second electrode 9 forms a thermocompression sonic structure and thus forms an intensive thermal and electrical contact with the second electrode 9. Said bonding tape 14 has a bonding tape arc 31 between the regions 25 and 26. A further bonding tape arc 32 is arranged between the regions 26 and 27, and reaches from the level of the rear side 10 of the semiconductor chip 5 as far as the level of the top side of the third external connection strip 15. For this purpose, the bonding tape 14 comprises a compliant metal such as aluminum or an aluminum alloy having a thickness d in micrometers of between 100 $\mu m \leq d \leq 200$ $\mu m$ given a width b in micrometers of between 500 $\mu m \leq b \leq 2000$ $\mu m$. In this case, the width b of the bonding tape 14 is less than or equal to the width B of the second electrode 9.

In this case, the external connection strips 12, 13 and 15 are formed as leads and partly project as far as the mutually opposite edges 17 and 19 of the semiconductor component 1. The leads have attachment pieces 29, which are mechanically connected to a separated leadframe during the method for producing the semiconductor component 1 and are then separated with the formation of the edge sides 17 and 19.

Figure 3:
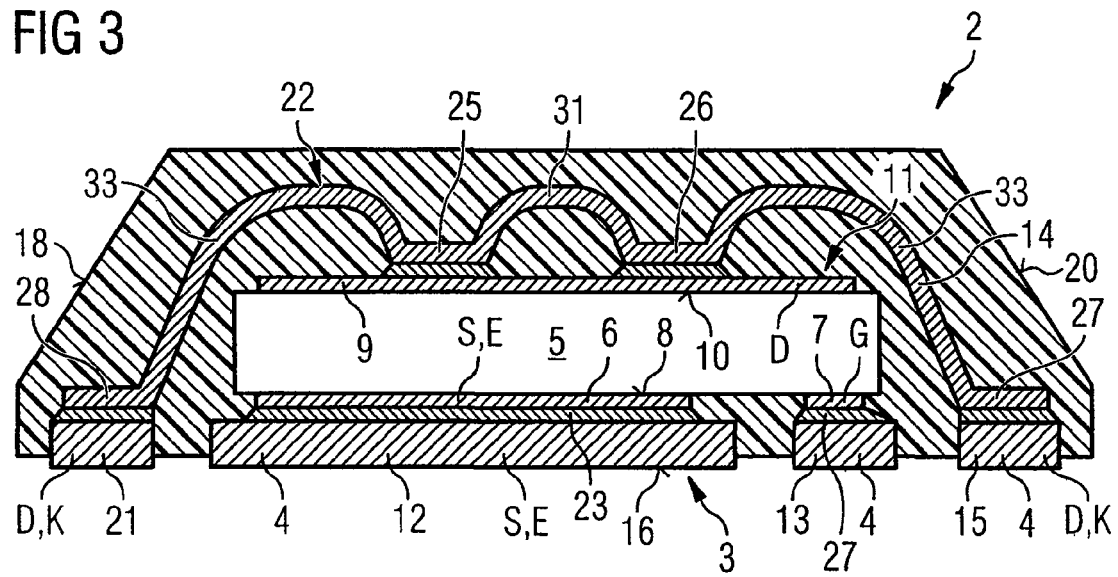
FIG. 3 shows a schematic cross section through a semiconductor component of a second embodiment.

FIG. 3 shows a schematic cross section through a semiconductor component 2 of a further embodiment. Components having the same functions as in the previous figures are identified by the same reference symbols and are not discussed separately.

In this further embodiment, the semiconductor component 2 has a fourth external connection strip 21, which is arranged in such a way that the external connection strips 12 and 13 are arranged between the third external connection strip 15 and the fourth external connection strip 21. The fourth external connection strip 21 is also connected via the bonding tape 14 to the second electrode 9 on the rear side 10 of the semiconductor chip 5 via a bonding arc 33. Consequently, the bonding tape 14 forms a thermal bridge 22 between the third and the fourth external connection strip 15 and 21, respectively, and the second electrode 9 on the rear side 10 of the semiconductor chip 5. Consequently, the flip-chip arrangement 11 of the semiconductor component 2 cost-effectively provides a thermal bridge 22 that improves the thermal properties of the semiconductor component 2. Moreover, by means of the bonding operation, it is possible to overcome any arbitrary height difference between the top sides of the external connection strips 21 and 15 and the rear side 10 of the semiconductor chip 5 with the aid of the bonding arcs 33 and 32, respectively.

Semiconductor components 2 of this type therefore do not rely on the storage of prefabricated connecting clips tailored to the respective thickness of a semiconductor chip.

The fabrication of a semiconductor component 2 of this type can be significantly reduced on account of the flip-chip arrangement 11 and the use of a bonding tape 14. In this case, the linking of the electrodes 6 and 7 situated on the top side 8 of the semiconductor chip 5 to the external connection strips 12 and 13, respectively, remains variable, so that cohesive connecting layers 23 which can be produced by different joining techniques can arise there.

Figure 4:
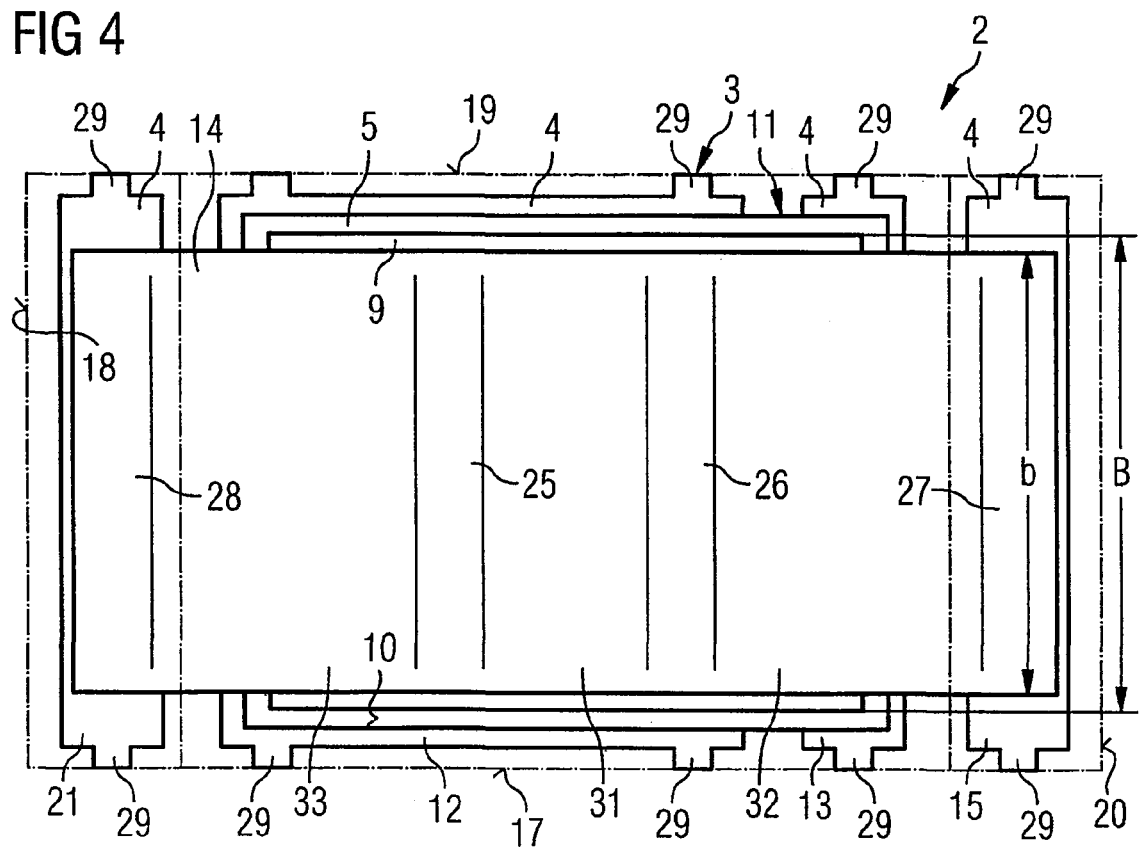
FIG. 4 shows a schematic plan view of the semiconductor component in accordance with FIG. 3.

FIG. 4 shows a schematic plan view of the semiconductor component 2 in accordance with FIG. 3. In this case, the bonding tape 14 shown here as a closed tape may perfectly well also be separated into individual bonding tape strips, which is possibly advantageous in the case of particularly wide bonding tapes 14 having a bonding tape width b, especially as lower press-on forces per bonding strip are to be applied during the thermocompression sonic method in order to realize the contact-connections in the regions 25, 26, 27 and 28.

FIGS. 5 to 11 show schematic views of components during the production of a semiconductor component 2 in accordance with FIG. 3. For this purpose, FIG. 5 shows a schematic plan view of a semiconductor component carrier 3 for a semiconductor component 2 in accordance with FIG. 3. Only one semiconductor component position from the semiconductor component carrier 3 is shown, which position is formed from lead material and has external connection strips 4. Said external connection strips 4 serve for making contact with the semiconductor component and partly carry a semiconductor chip (not shown) in a flip-chip arrangement.

FIG. 6 shows a schematic perspective view of the semiconductor component carrier 3 in accordance with FIG. 5. In this case, the external contact strips 4 are arranged parallel and extend from one edge side of the semiconductor component to an opposite edge side of the semiconductor component. Moreover, they have attachment pieces 29, by means of which they are originally linked with a leadframe, which is represented as separated here for the individual semiconductor component positions, so that only the severed connection pieces 29 can be seen.

Figure 7:
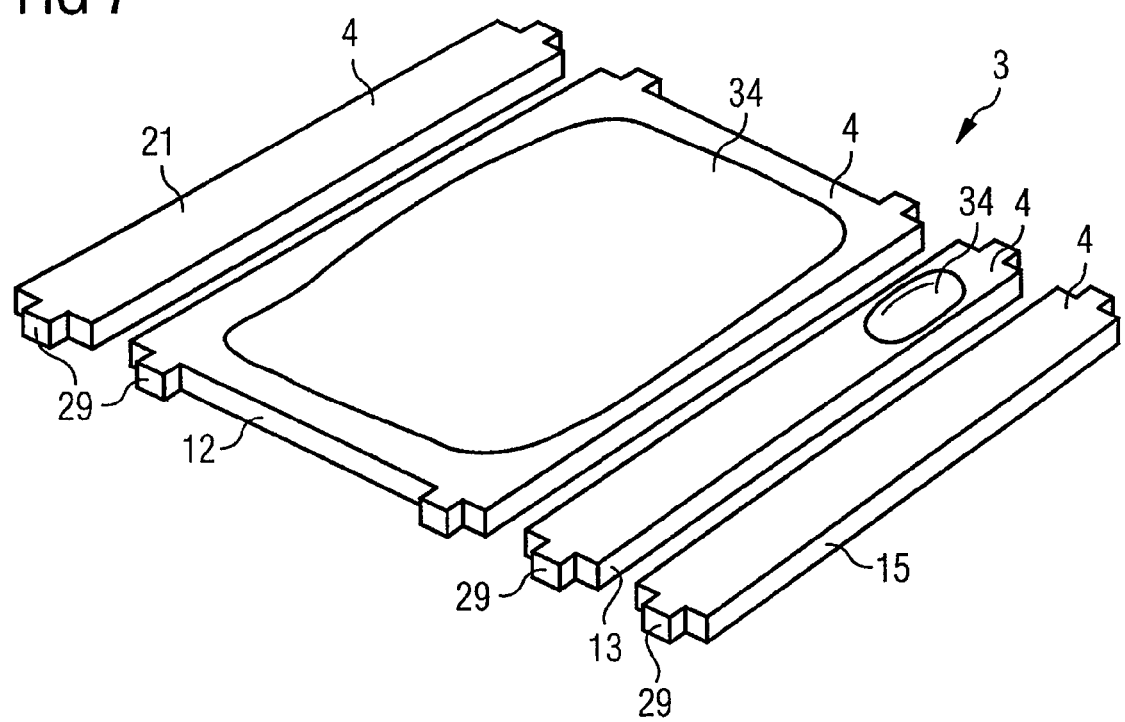

FIG. 7 shows a schematic perspective view of the semiconductor component carrier 3 in accordance with FIG. 6 after the application of a solder paste 34. Said solder paste 34 is not applied to the third external connection strip 15 and to the fourth external connection strip 21, but rather only to the external connection strips 12 and 13 arranged in between, the external connection strip 12 being formed with a larger area than the external connection strip 13, with the result that a larger area with solder paste 34 is arranged on the external connection strip 12, while only a small area of the external connection strip 13 is covered with solder paste 34. The size of these regions which are covered with solder paste 34 is adapted to the size of the electrodes on the top side of the semiconductor chip that is to be applied in flip-chip arrangement.

Figure 8:
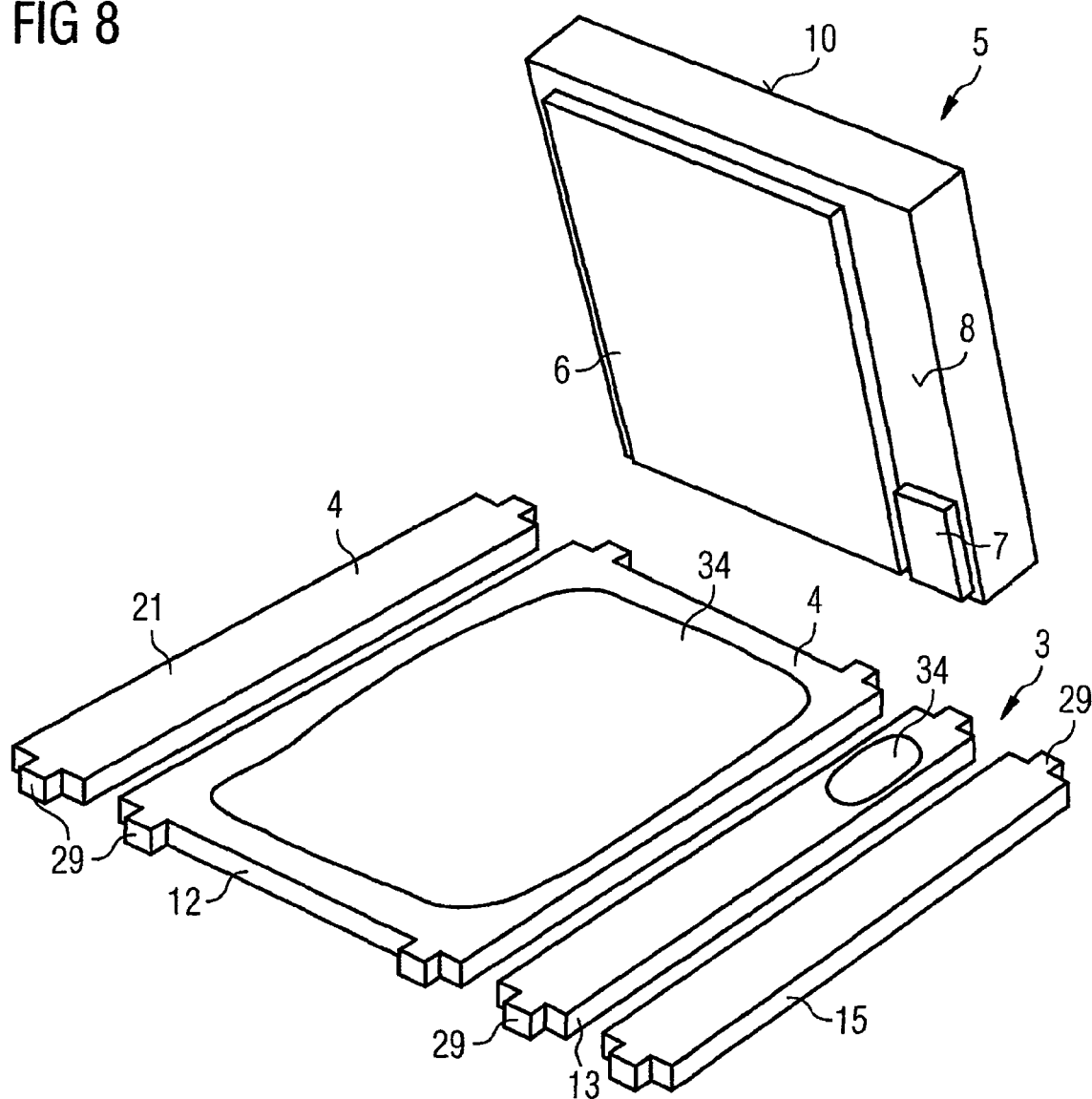

FIG. 8 shows a schematic perspective view of the semiconductor component carrier 3 in accordance with FIG. 7 with a semiconductor chip 5 prior to the application thereof to the semiconductor component carrier 3. In order to ensure that no short circuit occurs between the control electrode 7 and the first electrode 6 during the application of the semiconductor chip 5 on the semiconductor component carrier 3, the external connection strips 12 and 13 are spaced apart from one another and the applied solder pastes 34 are correspondingly limited in terms of their areal extent. The semiconductor chip 5 can then be applied in flip-chip arrangement to a semiconductor component carrier 3 prepared in this way.

Figure 9:
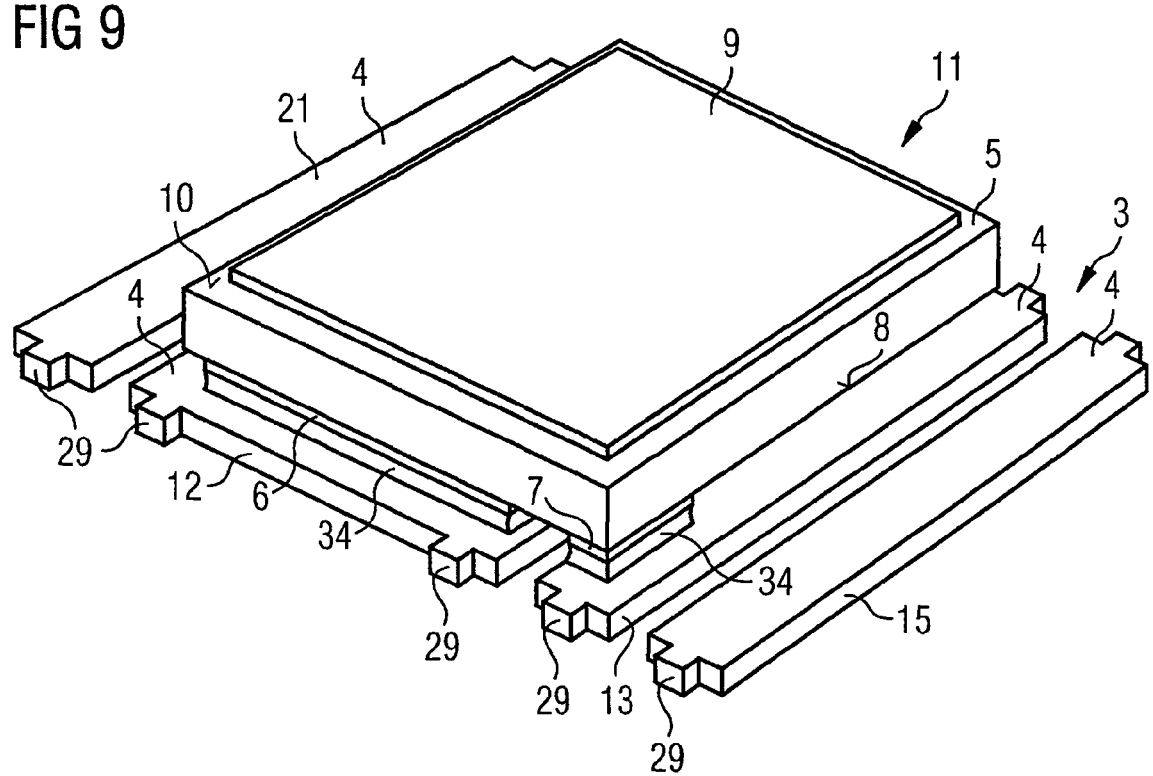

FIG. 9 shows a schematic perspective view of the semiconductor chip 5 in flip-chip arrangement 11 on the semiconductor component carrier 3. By virtue of the flip-chip arrangement 11, the first electrode 6 is fixed on the external connection strip 12 by means of the solder paste 34 and the control electrode 7 is likewise now electrically contact-connected, but on the external connection strip 13. The external connection strips 15 and 21 are not yet connected to the semiconductor chip 5 and are provided for the connection of the second electrode 6 on the rear side 10 of the semiconductor chip 5.

Figure 10:
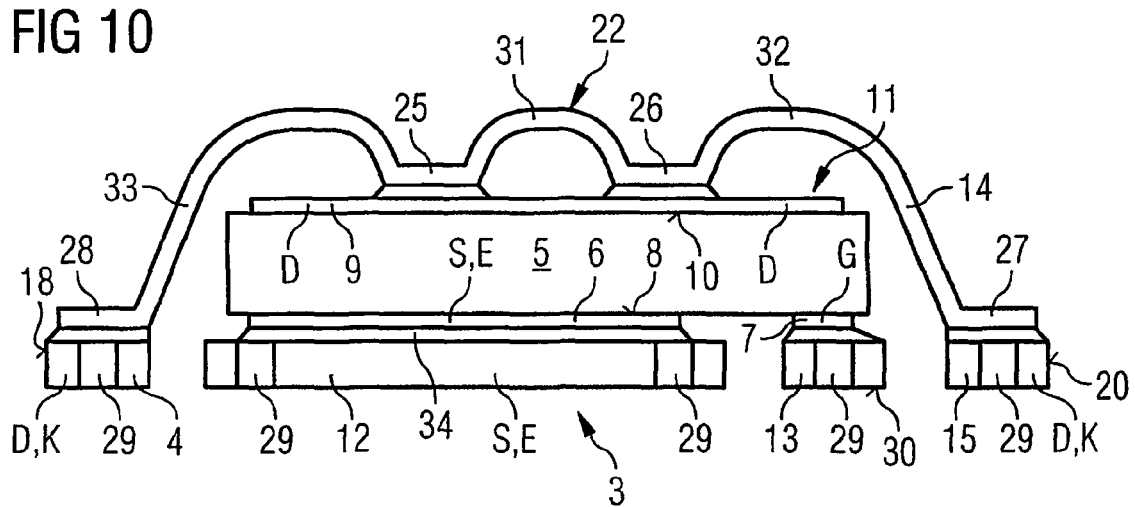

FIG. 10 shows a schematic side view of the semiconductor component carrier 3 with semiconductor chip 5 and applied bonding tape 14 without a plastic housing composition. In this case, in this embodiment, the first electrode 6 constitutes a source electrode S of a MOSFET structure and the control electrode 7 constitutes a gate electrode G and the second electrode 9 on the rear side 10 of the semiconductor chip 5 constitutes a drain electrode D. The source electrode S and the gate electrode G on the semiconductor chip top side 8 are applied on the leadframe by means of the solder paste 34 or else by means of a conductive adhesive using a flip-chip method. Once the semiconductor chip 5 has been fixed on the leadframe in a so-called reflow furnace, the bonding tape 14 is fitted on the semiconductor chip rear side 10. For this purpose, the bonding tape 14 has a thickness d in micrometers of between 100 µm≦d≦200 µm given a width b in micrometers of between 500 µm≦b≦2000 µm and, in this embodiment, is once again produced from aluminum or an aluminum alloy.

This combination of flip-chip arrangement 11 and bonding tape connection of the semiconductor chip rear side 10 makes it possible to utilize varying chip thickness without any modification of the bonding tape geometry, which is advantageous relative to the conventional "clip", as it is called, especially as, in the case of the semiconductor components illustrated here, the chip thickness is variable and, in contrast to "clip bonding", is not linked with the semiconductor chip thickness. Furthermore, the bonding tape connection affords a direct thermal contact between the rear side 10 of the semiconductor chip 5 and the external connection strips 4, while soldering or adhesive procedures that increase the thermal resistance are required in the case of so-called "clip bonding". Moreover, this construction can be used not only for individual semiconductor components 2 but also for so-called "chip-on-chip" modules, the previously used mounting method such as "chip-on-wire" or "chip-on-clip" being replaced by the method of "clip-on-ribbon" mounting described here.

Moreover, the flip-chip arrangement 11 combined with a bonding tape 14 enables a housing for a semiconductor chip variation with a common so-called "footprint". The bonding tape 14 can also be configured flexibly on the rear side 10 of the semiconductor chip 5 in a manner that departs from the manner illustrated here, with different linking areas. In the case of semiconductor chips 5 having a minimal areal extent, this construction described here additionally affords the possibility of a low-resistance connection since the area for the bonding tape exclusively represents a single potential. This is advantageous primarily with regard to further shrinks and miniaturizations in the semiconductor chip technology.

Figure 11:
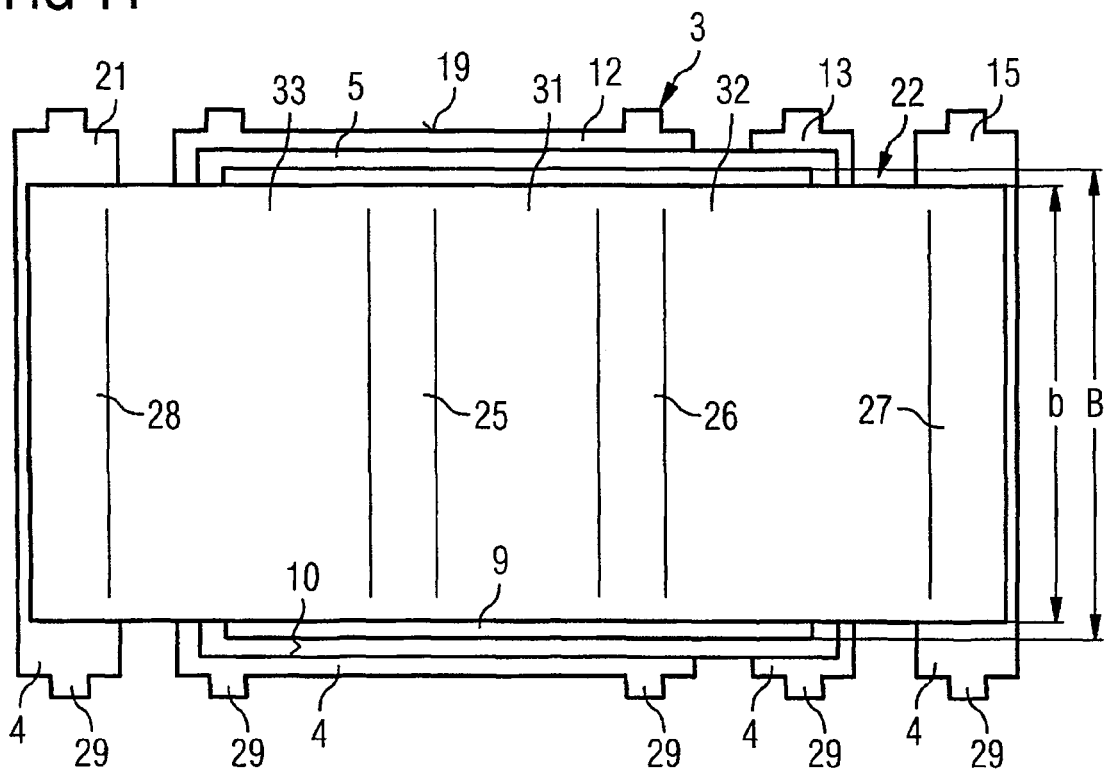

FIG. 11 shows a schematic plan view of the semiconductor component carrier 3 with semiconductor chip 5 in accordance with FIG. 10 and therefore corresponds to the illustration in FIG. 4 apart from the omitted plastic housing composition, with the result that a description of the functions of the reference symbols is unnecessary.

LIST OF REFERENCE SYMBOLS

1 Semiconductor component (embodiment)
2 Semiconductor component (further embodiment)
3 Semiconductor component carrier
4 External connection strip
5 Semiconductor chip
6 First electrode (source)
7 Control electrode (gate)
8 Top side of the semiconductor chip
9 Second electrode (drain)
10 Rear side of the semiconductor chip
11 Flip-chip arrangement
12 First external connection strip (for source)
13 Second external connection strip (for gate)
14 Bonding tape
15 Third external connection strip (for drain)
16 Underside of the semiconductor component
17 to 20 Edge side of the semiconductor component
21 Fourth external connection strip
22 Thermally conductive bridge
23 Cohesive connecting layer
24 Plastic housing composition
25 to 28 Region of the bonding tape
29 Attachment piece
30 External contact area
31 Bonding tape arc
32 Bonding tape arc
33 Bonding tape arc
34 Solder paste
b Width of the bonding tape
B Width of the second electrode
d Thickness of the bonding tape
D Drain electrode
E Emitter electrode
G Gate electrode
K Collector electrode
S Source electrode

The invention claimed is:

1. A semiconductor component comprising:
a semiconductor chip with a first electrode and a control electrode on its top side and a second electrode on its rear side, wherein
the semiconductor chip is fixed by its top side in flip-chip arrangement on a first external connection strip electrically connected to the first electrode and a second external connection strip electrically connected to the control electrode, wherein
the second electrode is electrically connected to a third external connection strip via bonding tape, wherein the bonding tape fully extends between the second electrode and the third external connection strip and wherein the first, second, and third external connection strips have external contact areas exposed to an outside of the semiconductor component in a direction facing in a same direction as the top side of the semiconductor chip.

2. The semiconductor component according to claim 1, wherein the first, second, and third external connection strips are arranged on an underside of the semiconductor component.

3. The semiconductor component according to claim 1, wherein the first, second, and third external connection strips are surface-mounted.

4. The semiconductor component according to claim 1, wherein the first, second, and third external connection strips are freely accessible on two opposite edge sides of the semiconductor component.

5. The semiconductor component according to claim 1, wherein each of the first, second, and third external connection strips is arranged on an underside of the semiconductor component and extends from an edge side to an opposite edge side of the semiconductor component.

6. The semiconductor component according to claim 1, wherein the first, second, and third external connection strips are arranged parallel alongside one another on an underside of the semiconductor component.

7. The semiconductor component according to claim 1, wherein the first, second, and third external connection strips comprise copper or a copper alloy and a coating toward the electrodes compose of gold, silver or palladium/gold or alloys thereof.

8. The semiconductor component according to claim 1, wherein the first, second, and third external connection strips are leads of a leadframe.

9. The semiconductor component according to claim 1, wherein a width of the bonding tape is less than or equal to a width of the second electrode.

10. The semiconductor component according to claim 1, wherein a plurality of bonding tapes, including the bonding tape, are arranged alongside one another on a width of the second electrode.

11. The semiconductor component according to claim 1, wherein the bonding tape comprises a gold-plated copper tape, an aluminum tape or a gold tape of alloys of copper, aluminum, or gold.

12. The semiconductor component according to claim 1, wherein a cohesive connecting layer is arranged between the first electrode and the first external connection strip, and also between the control electrode and the second external connection strip.

13. The semiconductor component according to claim 12, wherein the cohesive connecting layer comprises a soft solder layer.

14. The semiconductor component according to claim 12, wherein the cohesive connecting layer comprises a lead-free solder layer.

15. The semiconductor component according to claim 12, wherein the cohesive connecting layer comprises a layer of solder paste.

16. The semiconductor component according to claim 12, wherein the cohesive connecting layer comprises a diffusion solder layer.

17. The semiconductor component according to claim 12, wherein the cohesive connecting layer comprises an adhesive layer of a conductive adhesive.

18. The semiconductor component according to claim 1, wherein the bonding tape and the second electrode are cohesively connected via a thermocompression sonic structure.

19. The semiconductor component according to claim 1, wherein the semiconductor chip, the bonding tape and the first, second, and third external connection strips are embedded in a plastic housing composition whilst leaving free surface-mountable external contact areas of each of the first, second, and third external connection strips in a direction facing in a same direction as the top side of the semiconductor chip.

20. The semiconductor component according to claim 1, wherein the semiconductor chip comprises a MOSFET structure, and wherein the first electrode is a source electrode, the control electrode is a gate electrode and the second electrode is a drain electrode.

21. The semiconductor component according to claim 1, wherein the semiconductor chip comprises an IGBT structure, and wherein the first electrode is an emitter electrode, the control electrode is a gate electrode and the second electrode is a collector electrode.

22. The semiconductor component of claim 1, wherein a composition of the bonding tape is uniform along a length of the bonding tape extending between the second electrode and the third external connection strip.

23. The semiconductor component of claim 1, wherein the bonding tape has a thickness of between 100 micrometers and 200 micrometers.

24. The semiconductor component of claim 1, wherein the bonding tape has a width less than a width of the second electrode.

25. The semiconductor component of claim 1, wherein the bonding tape is a flexible strip.

26. The semiconductor component of claim 1, wherein the bonding tape is compliant and readily deformable.

27. The semiconductor component of claim 1, wherein the bonding tape is bonded to the second electrode by a plurality of separate bonds.

28. A semiconductor component comprising:
a semiconductor chip with a first electrode and a control electrode on its top side and a second electrode on its rear side, wherein
the semiconductor chip is fixed by its top side in flip-chip arrangement on a first external connection strip for the first electrode and a second external connection strip for the control electrode, wherein
the second electrode is electrically connected to a third external connection strip via bonding tape, wherein the bonding tape fully extends between the second electrode and the third external connection strip and wherein the first, second, and third external connection strips have external contact areas exposed to an outside of the semiconductor component in a direction facing in a same direction as the top side of the semiconductor chip,
wherein a fourth external connection strip is arranged on an underside of the semiconductor component, said fourth external connection strip being connected to the second electrode via the bonding tape in such a way that the bonding tape forms a thermally conductive bridge between the third and the fourth external connection strips and the second electrode.

29. The semiconductor component according to claim 28, wherein the first and second external connection strips are arranged on an underside of the semiconductor component between the third and the fourth external connection strips.

30. An apparatus, comprising:
a semiconductor chip having first and second opposing surfaces and comprising first and second electrodes on the first surface and a third electrode on the second surface;
a first external connection strip conductively connected to the first electrode;
a second external connection strip conductively connected to the second electrode; and
a third external connection strip electrically connected to the third electrode via bonding tape, wherein the bonding tape fully extends between the third electrode and the third external connection strip and wherein the first, second, and third external connection strips have external contact areas exposed to an outside of the semiconductor component in a direction facing in a same direction as the first surface of the semiconductor chip.

31. The apparatus of claim 30, wherein the first, second, and third external connection strips are all disposed on a same side of the semiconductor chip.

32. The apparatus of claim 30, wherein a composition of the bonding tape is uniform along a length of the bonding tape extending between the third electrode and the third external connection strip.

33. The apparatus of claim 30, wherein the semiconductor chip, the bonding tape and the first, second, and third external connection strips are embedded in a plastic housing composition whilst leaving free surface-mountable external contact areas of each of the first, second, and third external connection strips in a direction facing in a same direction as the first surface of the semiconductor chip.

34. A semiconductor component comprising:
a semiconductor chip with a first electrode and a control electrode on its top side and a second electrode on its rear side, wherein
the semiconductor chip is fixed by its top side in flip-chip arrangement on a first external connection strip electrically connected to the first electrode and a second external connection strip electrically connected to the control electrode, wherein
the second electrode is electrically connected to a third external connection strip via bonding tape, wherein the bonding tape fully extends between the second electrode and the third external connection strip and wherein the first, second, and third external connection strips have external contact areas exposed to an outside of the semiconductor component in a direction facing in a same direction as the top side of the semiconductor chip; and
further comprising a fourth external connection strip connected to the second electrode via the bonding tape in such a way that the bonding tape forms a thermally conductive bridge between the third and the fourth external connection strips and the second electrode.

* * * * *